United States Patent
Mayor et al.

(10) Patent No.: US 8,437,970 B2
(45) Date of Patent: May 7, 2013

(54) RESTORING AND STORING MAGNETOMETER CALIBRATION DATA

(75) Inventors: Robert Mayor, Half Moon Bay, CA (US); Ronald Keryuan Huang, Milpitas, CA (US); Patrick Piemonte, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 242 days.

(21) Appl. No.: 12/479,483

(22) Filed: Jun. 5, 2009

(65) Prior Publication Data

US 2010/0312513 A1 Dec. 9, 2010

(51) Int. Cl.
*G01C 17/38* (2006.01)
(52) U.S. Cl.
USPC .......... 702/92; 702/104; 702/93; 33/356
(58) Field of Classification Search .......... 702/92, 702/93, 104; 33/356
See application file for complete search history.

(56) References Cited

U.S. PATENT DOCUMENTS

| | | | |
|---|---|---|---|
| 5,165,269 A * | 11/1992 | Nguyen | 73/1.76 |
| 5,349,529 A * | 9/1994 | Masumoto et al. | 702/85 |
| 5,761,094 A | 6/1998 | Olson et al. | |
| 5,946,813 A | 9/1999 | Nachbaur et al. | |
| 6,311,129 B1 | 10/2001 | Lin | |
| 6,384,384 B1 | 5/2002 | Connolly et al. | |
| 6,408,245 B1 | 6/2002 | An et al. | |
| 6,424,914 B1 | 7/2002 | Lin | |
| 6,508,316 B2 | 1/2003 | Estes et al. | |
| 6,539,639 B2 * | 4/2003 | Smith | 33/356 |
| 6,622,091 B2 | 9/2003 | Perlmutter et al. | |
| 6,651,003 B2 | 11/2003 | Woloszyk et al. | |
| 6,768,452 B2 | 7/2004 | Gilkes | |
| 6,807,485 B1 | 10/2004 | Green | |

(Continued)

FOREIGN PATENT DOCUMENTS

| | | |
|---|---|---|
| EP | 1 221 586 | 7/2002 |
| JP | 2005-134343 | 5/2005 |
| WO | WO 2008/122904 | 10/2008 |
| WO | WO 2009/068116 | 6/2009 |

OTHER PUBLICATIONS

Honeywell 3-Axis Digital Compass IC, HMC5843 Electronic Compass, Honeywell International Inc. [online]; retrieved from the Internet: <URL:http:http://www.honeywell.com/sites/portal?smap=aerospace&page=Magnetic-Sensors3&theme=T15&catID=CF84B17AB-A90F-716D-10BC-A1E75441138E&id=HF916B4E0-4F71-9DB5-DFA8-51B1944918EE&sel=2&sel4=1>, retrieved on Jun. 5, 2005, 1 page.

(Continued)

*Primary Examiner* — Jonathan C Teixeira Moffat
*Assistant Examiner* — Regis Betsch
(74) *Attorney, Agent, or Firm* — Fish & Richardson P.C.

(57) ABSTRACT

Responsive to a recalibration trigger event, magnetometer data output by a magnetometer can be compared to historical magnetometer data previously output by the magnetometer. If a match is determined, a confidence of the match can be determined using theoretically constant data related to Earth's magnetic field. The constant data can be calculated from the historical magnetometer data. If the confidence of the match exceeds a confidence threshold level, historical calibration data can be used to calibrate the magnetometer. If the confidence of the match does not exceed the confidence threshold level, a calibration procedure can be performed to generate new calibration data, and the new calibration data can be used to calibrate the magnetometer.

15 Claims, 5 Drawing Sheets

U.S. PATENT DOCUMENTS

| | | | |
|---|---|---|---|
| 6,964,107 | B1 | 11/2005 | Ahola |
| 6,988,049 | B1 | 1/2006 | Wirtz et al. |
| 7,196,660 | B2 | 3/2007 | Abraham |
| 7,210,236 | B2 | 5/2007 | Sato et al. |
| 7,248,983 | B2 | 7/2007 | Fillatreau et al. |
| 7,275,008 | B2 | 9/2007 | Plyvanainen |
| 7,331,115 | B2 * | 2/2008 | Schierbeek et al. ............ 33/356 |
| 7,391,366 | B2 | 6/2008 | Park et al. |
| 7,451,549 | B1 * | 11/2008 | Sodhi et al. ..................... 33/356 |
| 7,458,166 | B2 | 12/2008 | Parks et al. |
| 7,548,200 | B2 | 6/2009 | Garin |
| 7,565,839 | B2 | 7/2009 | Stewart et al. |
| 7,631,119 | B2 | 12/2009 | Moore |
| 2003/0135327 | A1 | 7/2003 | Levine et al. |
| 2005/0174324 | A1 | 8/2005 | Liberty et al. |
| 2005/0223575 | A1 | 10/2005 | Fillatreau et al. |
| 2005/0240347 | A1 | 10/2005 | Yang |
| 2006/0066295 | A1 * | 3/2006 | Tamura et al. ................ 324/202 |
| 2006/0190174 | A1 | 8/2006 | Li et al. |
| 2006/0195254 | A1 | 8/2006 | Ladetto et al. |
| 2006/0271295 | A1 | 11/2006 | McLaren et al. |
| 2007/0156337 | A1 | 7/2007 | Yanni |
| 2008/0066331 | A1 | 3/2008 | Brzezinski et al. |
| 2008/0201096 | A1 | 8/2008 | Wright et al. |
| 2009/0033807 | A1 | 2/2009 | Sheng et al. |
| 2009/0054075 | A1 | 2/2009 | Boejer |
| 2009/0070058 | A1 | 3/2009 | Lin |
| 2009/0089001 | A1 | 4/2009 | Lin |
| 2009/0171607 | A1 | 7/2009 | Chen et al. |
| 2009/0326851 | A1 | 12/2009 | Tanenhaus |
| 2010/0121599 | A1 | 5/2010 | Boeve et al. |

OTHER PUBLICATIONS

PNI Sensor Corporation, "Application Note: Calibration Computations for Practical Compassing using the PNI-11096 Magnetometer ASIC," Doc # 1000006, Aug. 2008, 3 pages.

Westerberg, Tommy, 'Compass Go', Apple Apps Store, Oct. 10, 2008, 3 pages.

Harper et al., "Process for Improving GPS acquisition assistance data and server-side location determination for cellular networks," 2004 Intl Symp on GNSS/GPS, Dec. 6-8, 2004, Sydney, Australia, 15 pages.

Seong Yun Cho et al., "A Calibration Technique for a Two-Axis Magnetic Compass in Telematics Devices", Jun. 2005, ETRI Journal, vol. 27, No. 3, pp. 280-288.

Chris M. Goulet, "Magenetic Declination, Frequently Asked Questions", Oct. 2001, Version 4.4, [Online] [Retrieved on May 16, 2009]. Retrieved from the Internet: URL: http://www.geocities.com/magnetic_declination/, 16 pages.

PNI Sensor Corporation, "Calibration Computations for Practical Compassing using the PNI-11096 Magnetometer ASIC", Aug. 2008, PNI Corporation ©2001, Santa Rosa, CA, 3 pages.

PNI Sensor Corporation, "Multipoint Calibration Primer", (no publication date available), PNI Corporation, Santa Rosa, CA, 10 pages.

An Overview of the Earth's Magnetic Field, "The Earth's Magnetic Field—An Overview", [Online] [Retrieved on May 16, 2009]. Retrieved from the Internet: URL: http://www.geomag.bgs.ac.uk/earthmag.html, 10 pages.

The Earth's magnetic field, EPS 122: Lecture 5—Earth's magnetic field, 11 pages.

Apptism, iTopoMaps, ©2009 Apptism, [Online] [Retrieved on Jun. 2, 2009]. Retrieved from the Internet: URL: http://www.apptism.com/apps/itopomaps, 4 pages.

Apptism, Compass Go, ©2009 Apptism, [Online] [Retrieved on Jun. 3, 2009]. Retrieved from the Internet: URL: http://www.apptism.com/apps/compass-go, 2 pages.

Apptism, Focalware, ©2009 Apptism, [Online] [Retrieved on Jun. 3, 2009]. Retrieved from the Internet: URL: http://www.apptism.com/apps/focalware, 2 pages.

Huang et al., "Automatically Identifying Geographic Direction", U.S. Appl. No. 12/477,865, filed Jun. 3, 2009.

Mayor et al., "Magnetometer Accuracy and Use", U.S. Appl. No. 12/479,717, filed Jun. 5, 2009.

Mayor et al., "Context Determination to Assist Location Determination Accuracy", U.S. Appl. No. 12/549,250, filed Aug. 27, 2009.

Adiprawita et al., "Development of AHRS (Attitude and Heading Reference System) for Autonomous UAV (Unmanned Aerial Vehicle)," Proc Int'l Conf Electrical Engineering and Informatics, Institut Teknologi Bandung, Indonesia, Jun. 17-19, 2004, 4 pages.

Zhang and Gao, "A Novel Auto-calibration Method of the Vector Magnetometer," Ninth Intl Conf on Electronic Measurement & Instruments, ICEMI '2009, pp. 1-145 through 1-150.

Camps et al., "Numerical Calibration for 3-Axis Accelerometers and Magnetomors," IEEE, 2009, pp. 217-231.

Moore et al., "Calibrating Sensor Measurements on Mobile Devices," U.S. Appl. No. 12/886,494, filed Sep. 20, 2010.

Piemonte et al., "Determining Heading Using Magnetometer Data and angular Rate Data", U.S. Appl. No. 12/886,531, filed Sep. 20, 2010.

Tu, "Magnetometer Calibration," U.S. Appl. No. 12/899,392, filed Oct. 6, 2010.

Piemonte, et al., "Dynamic Compass Calibration in a Portable Device", U.S. Appl. No. 12/479,203, filed Jun. 5, 2009.

Mayor et al., "Accuracy Indications for an Electronic Compass in a Portable Device", U.S. Appl. No. 12/479,196, filed Jun. 5, 2009.

* cited by examiner

HISTORICAL MAGNETOMETER DATA

| DAC (x, y, z) | Offsets (x, y, z) | F (nT) | Φ | Time | Other |
|---|---|---|---|---|---|
| 15, 10, 3 | 10, 25, 18 | 30,000 | 95° | 5/20/9 14:00 | Temp, Cal. Level |
|  |  |  |  |  |  |
|  |  |  |  |  |  |
|  |  |  |  |  |  |
|  |  |  |  |  |  |
|  |  |  |  |  |  |
|  |  |  |  |  |  |

RESTORING AND STORING MAGNETOMETER CALIBRATION DATA

TECHNICAL FIELD

This subject matter is related generally to magnetometer calibration.

BACKGROUND

A mobile device such as a cellular phone or a smart phone, PDA, handheld computer, navigational device, gaming device, netbook, among others can be equipped with a magnetometer. Magnetic readings from the magnetometer can be used to provide a user with a direction, which may be a "heading" (typically given relative to the Earth's true North), and/or an arrow pointing to true North. The direction information may be provided for the user's own navigation knowledge, for example, to tell the user which way is north while the user is walking or driving in unfamiliar surroundings. The direction information can also be used by a navigation or map application that may be running on the mobile device.

The magnetometer obtains a measure of the magnetic field that is present in the immediate surroundings of the mobile device as a two or three-component vector in a Cartesian coordinate system using 2-axis or 3-axis magnetic sensors. The sensed magnetic field can contain a contribution of the Earth's magnetic field and a contribution by a local interference field (device co-located interference fields). The latter is a magnetic field that is created by components in the local environment of the mobile device. This may include contributions by one or more magnetic field sources that are near the magnetic sensors, such as the magnet of a loudspeaker that is built into the mobile device. The interference field may also have a contribution due to one or more magnetic objects found in the external environment close to the device, such as when the user is driving an automobile, riding in a train or bus, or riding on a bicycle or motorcycle. In most cases, the interference field is not negligible relative to the Earth's magnetic field. Therefore, a calibration procedure is needed to reduce the adverse impact of the interference field contribution from the sensors' measurements to allow the magnetometer to calculate a more accurate direction.

There are several types of 3-axis calibration procedures. In one such technique, the user is instructed to rotate the mobile device (containing the magnetometer) according to a set of geometrically different orientations and azimuth angles, while measurements by the magnetometer and by an orientation sensor are collected and analyzed to isolate or quantify the interference field. The quantified interference field can then be subtracted from the measurement taken by the magnetic sensor to yield the Earth's geomagnetic field. The Earth's geomagnetic field can be further corrected to get the true north direction, such as correcting for magnetic variation (declination) due to the variation of the Earth's magnetic field based on geographic location.

In another 3-axis calibration technique, rather than instruct the user to deliberately rotate the mobile device in a predetermined manner, measurements are collected from the magnetometer, continuously over a period of time, while the mobile device is being used or carried by the user. This can lead to random (albeit sufficient) rotations of the mobile device, such that the magnetometer measurements define a desired, generally spherical measurement space. The sphere is offset from the origin of a coordinate system for the Earth's geomagnetic field vector by an unknown offset vector, which can represent a substantial part (if not all) of the interference field. Mathematical processing of the measurements can be performed to "re-center" the sphere by determining the offset vector. This technique is transparent to the user because the user is not required to go through a calibration procedure where the user deliberately rotates the device through a specified set of orientations.

The calibration techniques described above are effective but time consuming. As the user travels with the mobile device, the magnetometer will encounter different magnetic environments with varying local interference. These different magnetic environments can require a recalibration procedure and the calculation of a new offset vector. Even if the user returns to a previous location, a recalibration procedure may be required due to a change in the local interference field.

SUMMARY

Responsive to a recalibration trigger event, magnetometer data output by a magnetometer can be compared to historical magnetometer data previously output by the magnetometer. If a match is determined, a confidence of the match can be determined using data related to Earth's magnetic field or other characteristics of the environment. The data can be calculated from the historical magnetometer data. If the confidence of the match exceeds a confidence threshold level, historical calibration data can be used to calibrate the magnetometer. If the confidence of the match does not exceed the confidence threshold level, a calibration procedure can be performed to generate new calibration data, and the new calibration data can be used to calibrate the magnetometer.

DETAILED DESCRIPTION

The Earth's Magnetic Field

Overview

Figure 1A:
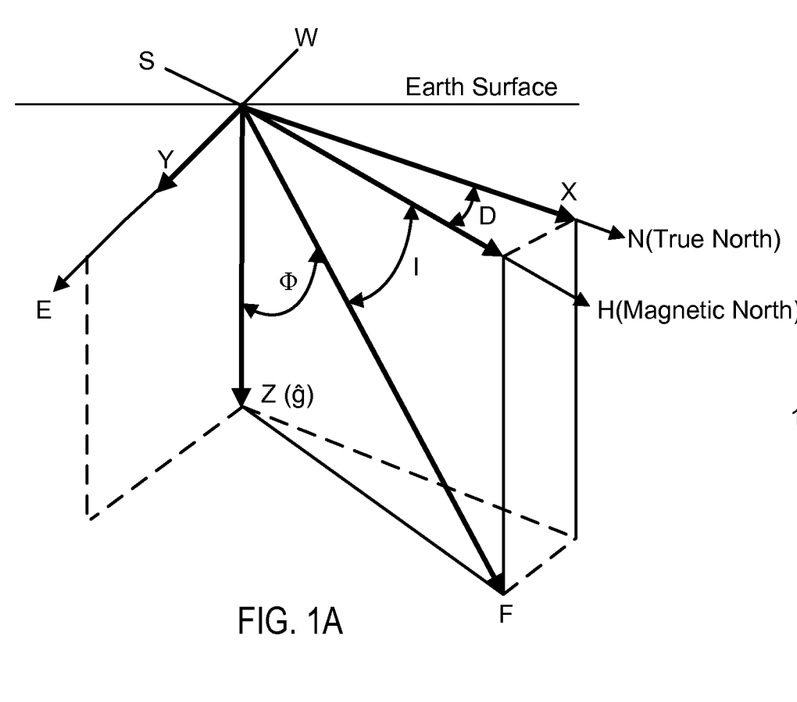
FIG. 1A illustrates an exemplary Cartesian coordinate system describing the Earth's geomagnetic field in accordance with some implementations.

FIG. 1A illustrates an exemplary Cartesian coordinate system for describing the Earth's geomagnetic field in accordance with some implementations. The Earth's geomagnetic field vector, $\vec{F}$, can be described by the orthogonal components X (northerly intensity), Y (easterly intensity) and Z (vertical intensity, positive downwards); total intensity F; horizontal intensity H; inclination (or dip) I and declination (or magnetic variation) D. Declination, inclination and total intensity can be computed from the orthogonal components using the equations $$D = \arctan\left(\frac{Y}{X}\right), \quad (1)$$

$$I = \arctan\left(\frac{Z}{H}\right), \quad (2)$$

$$F = \sqrt{H^2 + Z^2}, \text{ and} \quad (3)$$

where H is given by $$H = \sqrt{X^2 + Y^2}. \quad (4)$$

An angle $\Phi$ can be defined as the angle between the geomagnetic field vector, F, and the Earth's gravitational acceleration vector $\hat{g}$ (which is aligned with the Z component of the Earth's geomagnetic field vector). The angle $\Phi$ can be determined from the inclination angle I, or $\Phi = 90° - I$. At any given position on Earth, the total intensity F is constant, regardless of magnetometer orientation. Also, at any given position on Earth, the angle $\Phi$ is constant, regardless of magnetometer orientation. The International System of Units (SI) unit of magnetic field intensity most commonly used is the Tesla.

Figure 1B:
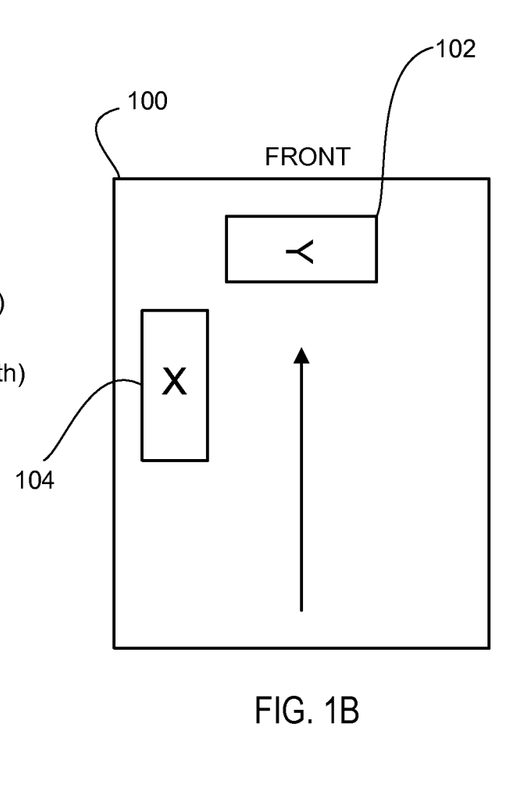
FIG. 1B illustrates an exemplary 2-axis magnetometer in accordance with some implementations.

FIG. 1B illustrates an exemplary 2-axis magnetometer in accordance with some implementations. Magnetometers can be 2-axis or 3-axis and the processes described here apply to both types of sensors. In the interest of brevity, only a 2-axis magnetometer is described.

In some implementations, 2-axis magnetometer sensor configuration 100 can be used to calculate a heading for a variety of applications, including applications running on a mobile device. Sensor configuration 100 can include two magnetic field sensors 102, 104 mounted orthogonally on a board, substrate or other mounting surface. Magnetic sensors 120, 104 can be included in an integrated circuit (IC) package with or without other sensors, such as accelerometers and gyros.

Sensor configuration 100 can be deployed in a host system environment that contains interfering magnetic fields. Since the Earth's magnetic field is a weak field (a 0.5 Gauss), nearby magnetic objects (co-located with the mobile device) can interfere with the accurate measurements of sensors 102, 104. A calibration procedure can be deployed to isolate and remove the local magnetic interference. One technique is to determine offsets or offset vector which can be subtracted from sensor measurements to get accurate measurements of the Earth's magnetic field. For 3-axis sensors, a third component, Z, can be adjusted with an offset as well.

In one exemplary calibration procedure for a 2-axis magnetometer, each heading computation can be assumed to be made with a number of valid X and Y sensor readings which can be taken with a minimal delay between each reading. For this sensor configuration, sensors 102, 104 are at right angles with respect to each other and lie level with respect to the Earth's surface. By convention, the positive end of the X-axis points to the North and the positive end of the Y-axis points to the East. For this example, two consecutive sensor readings are made during calibration that are 180 degrees apart. These measurements can be represented by (X1, Y1) and (X2, Y2). The Earth's magnetic field in any given direction as measured with no interfering field can be represented by offset pair ($X_E$, $Y_E$). Magnetic interference can be represented by ($X_{offset}$, $Y_{offset}$). Using these mathematical conventions, the two sensor readings can be represented by $$X1 = X_E + X_{offset};$$

$$Y1 = Y_E + Y_{offset};$$

$$X2 = -X_E + X_{offset}; \text{ and}$$

$$Y2 = -Y_E + Y_{offset}. \quad (5)$$

Assuming the magnetometer is fixed with respect to the host system (e.g., a magnetometer installed in a mobile phone), the readings (X1, Y1) and (X2, Y2) taken during calibration will both contain the same interference values ($X_{offset}$, $Y_{offset}$). Since the magnetometer readings taken during calibration are 180 degrees apart the readings are equal but opposite in sign. Solving the equations above for $X_{offset}$ and $Y_{offset}$ yields $$X_{offset} = (X1 + X2)/2, \text{ and}$$

$$Y_{offset} = (Y1 + Y2)/2. \quad (6)$$

A measurement of the sensor readings can be represented by ($X_E$, $Y_E$). In some implementations, a basic calculation of the heading can be performed using $X_E$ and $Y_E$ and the equation:

$$A_{heading} = \arctan(Y_E, X_E), \quad (7)$$

where the resulting heading $A_{heading}$ can be mapped into the correct quadrant based on the signs of $X_E$ and $Y_E$. The heading $A_{heading}$, calculated from measurements provided by the magnetometer, is a magnetic heading that can be corrected by combining the declination with the heading $A_{heading}$ to identify a heading relative to true north.

Other implementations are possible. For example, the heading can also be calibrated based on the orientation of the device obtained from an accelerometer, inclination, GPS, and other types of corrections or calibrations.

Once the offsets are determined, the offsets can be subtracted from a subsequent sensor reading (X3, Y3).

$$X_E = X3 - X_{offset};$$

$$Y_E = Y3 - Y_{offset}. \quad (8)$$

Some additional techniques for performing 2-dimensional and 3-dimensional electronic magnetometer calibration are described in co-pending patent application Ser. No. 12/479,182, filed Jun. 5, 2009, for "Calibration Techniques For An Electronic Compass In A Portable Device," which is incorporated by reference herein in its entirety.

If a magnetometer is included in a mobile device, such as a mobile phone, the local magnetic interference can change. For example, if the user docks his mobile device (containing the magnetometer) in his car, magnetic objects in the car could change the local interference. This could result in the calibration offsets becoming invalid. If the offsets are invalid, then the magnetometer can perform a recalibration procedure to generate new offsets. This recalibration procedure can be a tedious process for the user if performed often, and may require the user to manipulate the mobile device through a number of angles.

Example Calibration System

Figure 2:
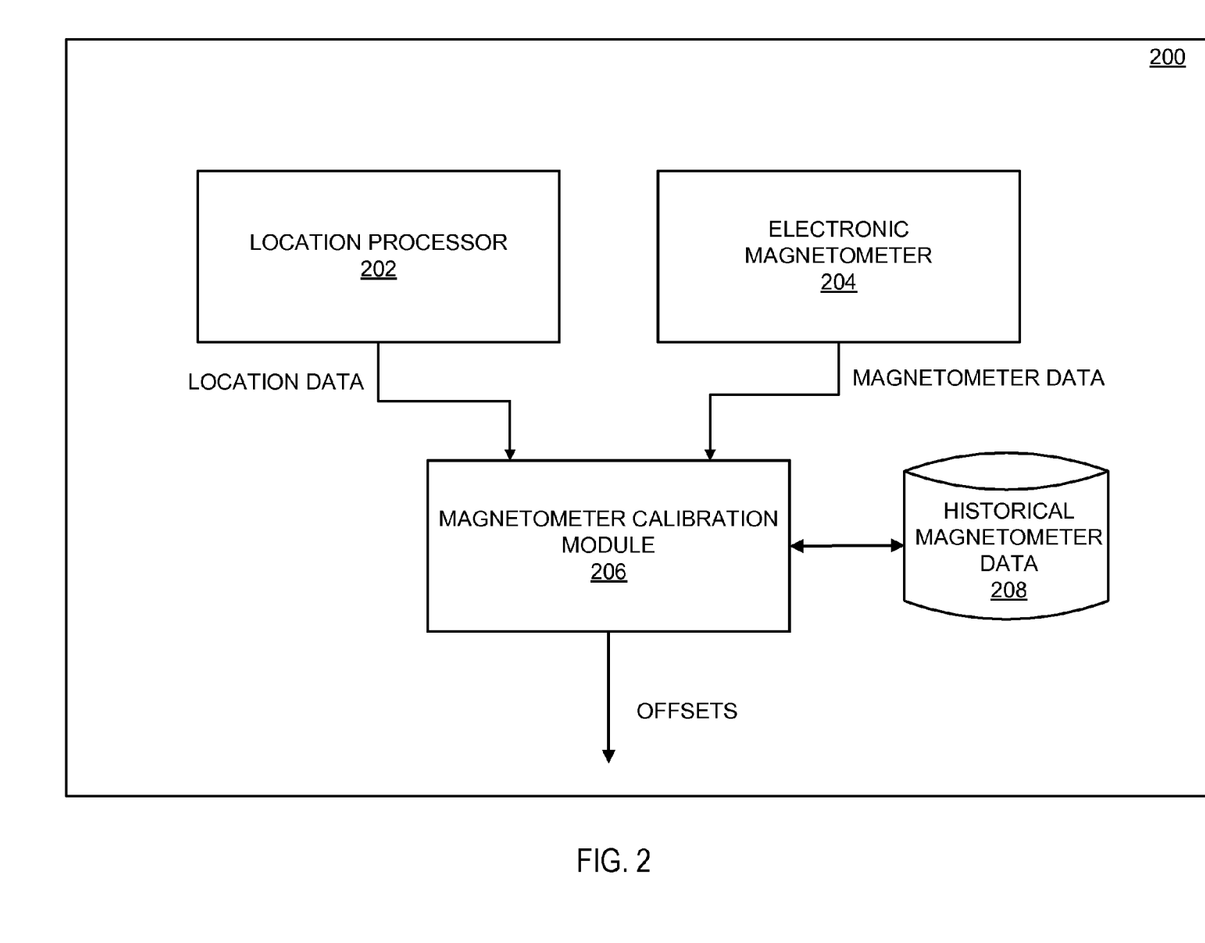
FIG. 2 is a block diagram of exemplary calibration system in accordance with some implementations.

FIG. 2 is a block diagram of an exemplary calibration system 200 in accordance with some implementations. Calibration system 200 can include location processor 202, magnetometer 204, magnetometer calibration module 206 and historical magnetometer data 208. Calibration system 200 can be implemented in software, firmware, hardware or a combination thereof. Location processor 202 can be a GPS receiver or some other processor or receiver for implementing cell tower positioning technology or a Wi-Fi positioning technology (e.g., Skyhook™). Magnetometer 204 can be a 2-axis or 3-axis magnetometer sensor. Magnetometer calibration module 206 can be software that receives position data and magnetometer data from location processor 202 and magnetometer 204, respectively. Some examples of magnetometer data include the data described in reference to FIG. 3.

In some implementations, calibration system 200 can respond to a recalibration trigger event. A recalibration trigger event can be any event that triggers a recalibration procedure on the mobile device. The trigger event can be based on time, location, mobile device activity, an application request, magnetometer data, etc. Responsive to the recalibration trigger event, location processor 202 can determine a current position of the mobile device. The position information can be used with an Earth geomagnetic field model (e.g., $10^{th}$ Generation IGRF model) to provide various parameters related to the Earth's magnetic field, which can be used to recalibrate the magnetometer 204. For example, declination D, inclination I and total intensity F can be determined from the position information. The angle $\Phi$ can be determined from the inclination, I, or the dot product of $\overline{F}$ and the gravitational vector, $\hat{g}$, which can be received from location processor 202 and/or taken from an accelerometer reading. Once these parameters are determined, one or more of the parameters (collectively referred to as "historical magnetometer data") can be stored in a look up table or other repository for subsequent search and retrieval during the process 400, as described in reference to FIG. 4.

Example Look Up Table of Historical Magnetometer Data

Figure 3:
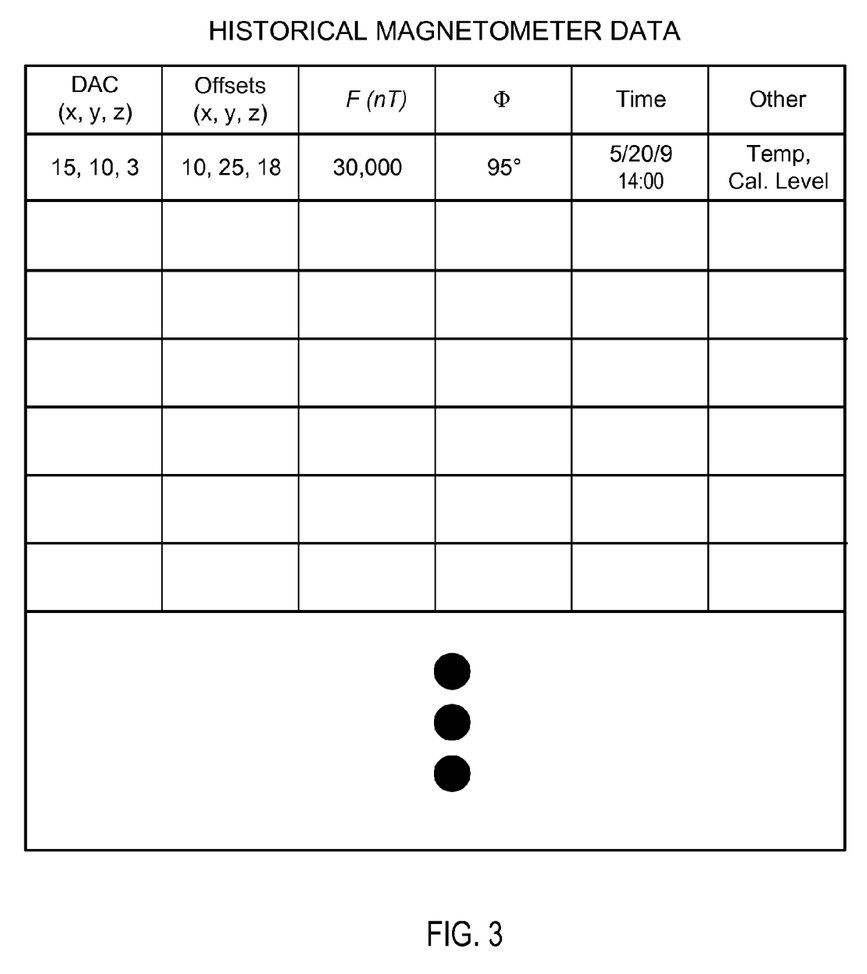
FIG. 3 illustrates an exemplary look up table for storing historical magnetometer data in accordance with some implementations.

FIG. 3 illustrates an exemplary look up table for storing historical magnetometer data in accordance with some implementations. Each time a calibration procedure is performed, magnetometer data is stored in a lookup table. FIG. 3 is one exemplary format for a lookup table storing magnetometer data, referred to as historical magnetometer data. Some examples of historical magnetometer data are DAC, Offsets, F and $\Phi$. Other parameters can be stored in the look up table as needed, including but not limited to temperature, calibration level, and a timestamp. The total intensity of the Earth's magnetic field, F, and the angle, $\Phi$, were previously discussed and should be theoretically constant regardless of the position of the magnetometer on the Earth or its orientation. If these parameters are not constant then the local magnetic interference may have changed. This constant property makes these Earth magnetic field parameters useful for determining the confidence of a match, as described in reference to FIG. 4.

In some implementations, a magnetometer reading can provide digital to analog converter (DAC) data and Raw data. The DAC data can be used to adjust the dynamic range of the Raw data. An exemplary range for DAC data can be +/−128 units, where each unit represents a defined magnetic quantity U (e.g., 16 uT). There can be DAC data for each sensor in X, Y and Z directions of a sensor coordinate system, assuming a 3-axis electronic magnetometer. The Raw data are magnetic sensor readings which, in some electronic magnetometers can be stored in three separate hardware registers (e.g., three 8-bit registers for each sensor output). The Raw data can be in the range of +/−128 units, where each unit represents a defined magnetic quantity U (e.g., 16 uT). Using an electronic magnetometer that provides output as described above results in the following equations for sensor readings along X, Y and X sensor axes, where n indicates the nth sensor reading $X_n = DAC_{X_n} * U + \text{Raw}_{X_n}$ $Y_n = DAC_{Y_n} * U + \text{Raw}_{Y_n}$ $Z_n = DAC_{Z_n} * U + \text{Raw}_{Z_n}$ (9)

Other parameters like temperature, calibration level and a timestamp can also be stored in the look up table as historical magnetometer data. The calibration level can be used to determine the accuracy or quality of a set of calibration data (e.g., offset values), so that an accurate set of calibration data are not overwritten with a less accurate set of calibration data. The timestamp can be used to manage entries in the look up table. For example, the timestamp can be used with an "aging" algorithm for overwriting entries in the look up table, so that the look up table does not grow too large. In one implementation, entries with the oldest timestamp can be overwritten first. In other implementations, a count is kept for each entry in the lookup table which can be incremented each time an entry is used to restore calibration offsets. The entries with the lowest count can be overwritten first. In still other implementations, both timestamps and counts can be used for managing look up table entries.

Once the lookup table is populated with historical magnetometer data for at least one recalibration event, the table can be searched during a matching process based on one or more of the historical magnetometer data in the table. For example, DAC and/or Raw data can be used for the matching step in process 400, as described in reference to FIG. 4.

Example Process for Restoring and Storing Magnetometer Calibration Data

Figure 4:
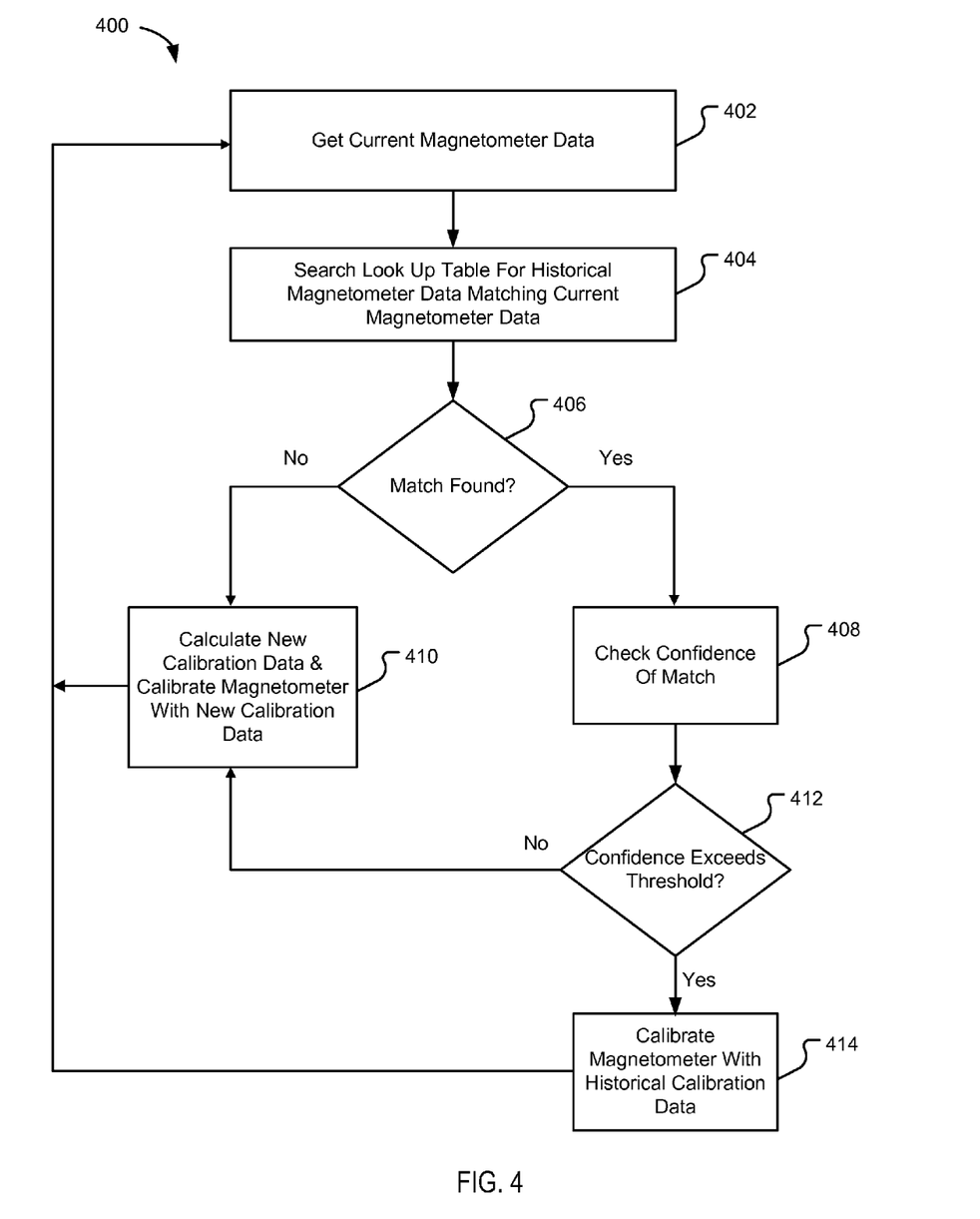
FIG. 4 is a flow diagram of an exemplary process for restoring and storing magnetometer calibration data in accordance with some implementations.

FIG. 4 is a flow diagram of an exemplary process 400 for restoring and storing magnetometer calibration data for an magnetometer. In some implementations, process 400 can begin when a calibration trigger event is received. The trigger event can be automatic or initiated by a user. In response to the calibration trigger event, process 400 can get a magnetometer reading from the magnetometer (402).

A lookup table containing historical magnetometer data previously output by the magnetometer can be searched for a match with the reading (404). The lookup table can be stored in memory of the mobile device. For example, current DAC data can be compared with corresponding historical DAC data stored in entries of the look up table. If a match is found (406), then a confidence check for the match can be determined (408).

In some implementations, an absolute reading can be used as match data. The absolute reading, $R_n$, can be computed, for example, from equation (9) as $R_n = \sqrt{X_n^2 + Y_n^2 + Z_n^2}$. (10)

The absolute reading parameter can be computed during each calibration event and stored in the look up table. During (404), a current absolute reading can be calculated and compared with the stored absolute reading to determine a matched entry. In some implementations, DAC and/or Raw data may not be available from the magnetometer. In such implementations, any suitable magnetometer data can be used as match data.

In some implementations, the confidence of a match can be checked by using the offsets stored in the matched entry to compute a total intensity value F and an angle, $\Phi$, then comparing these calculated values with the historical values for F and $\Phi$ stored in the look up table. For example, the historical offsets can be used as offset pair ($X_{offset}$, $Y_{offset}$) in equation (8) for a 2-axis magnetometer, to generate the Earth's magnetic field vector $\vec{F}$. The dot product of the Earth's magnetic vector, $\vec{F}$, and the gravitational acceleration vector $\hat{g}$ (e.g., taken from an accelerometer reading) gives the angle $\Phi$. The magnitude of the Earth's magnetic vector $|\vec{F}|$ will give the total intensity F.

Since F and $\Phi$ should be theoretically constant if the local magnetic interference due to the host environment has not changed, a change in F and $\Phi$ indicates a change in local magnetic interference, and possibly invalid offsets. For example, if the user docks his mobile device (containing the magnetometer) in his car, magnetic objects of the car can cause F and $\Phi$ to change due to the change in magnetic interference caused by those magnetic objects. In practice, some change should occur due to other characteristics of the host environment, such as device state and temperature. To address these other characteristics, a threshold value (e.g., a percent deviation) can be used to determine when a detected change between current and historical magnetometer data is due to a change in the local magnetic interference.

In some cases, the look up table can be searched for an exact match between current DAC data and the historical DAC data stored in the look up table. In other cases, there is no historical DAC data that is an exact match. In such cases, a regression or curve fitting technique (e.g., method of least squares) can be used on the historical DAC data stored in the table to determine historical DAC data having the closest match to the current DAC. If the "best fit" historical DAC data resulting from the curve fit is outside the current DAC data range, the corresponding offsets will need to be adjusted. For example, if the DAC data in the table is larger than the current DAC data range, then the corresponding offsets will be larger. The offsets for the X, Y, Z sensor axes can be adjusted by the difference between the current DAC data and table DAC data times the resolution of the DAC (e.g., 16 uT). Exemplary pseudocode for adjusting offsets in a look up table to fit a particular DAC data range is shown below.

Example Pseudocode for Adjusting Offsets to Fit a DAC

```
// method for adjusting offsets to fit a particular dac
bool Compass::adjustOffsets(const vector &dac, TrainedEntry &entry)
{
// if the DAC value is less, then the offset must be larger
// adjust x
if (entry.dac.u.x < dac.u.x) {
entry.offsets.u.x +=(abs(dac.u.x –
entry.dac.u.x)*kDacResolutionInOffset);
} else {
entry.offsets.u.x –=(abs(dac.u.x –
entry.dac.u.x)*kDacResolutionInOffset);
}
// adjust y
if (entry.dac.u.y < dac.u.y) {
entry.offsets.u.y +=(abs(dac.u.y –
entry.dac.u.y)*kDacResolutionInOffset);
} else {
entry.offsets.u.y –=(abs(dac.u.y –
entry.dac.u.y)*kDacResolutionInOffset);
}
// adjust z
if (entry.dac.u.z < dac.u.z) {
entry.offsets.u.z +=(abs(dac.u.z –
entry.dac.u.z)*kDacResolutionInOffset);
} else {
entry.offsets.u.z –=(abs(dac.u.z –
entry.dac.u.z)*kDacResolutionInOffset);
}
}
```

If the difference between the current and stored values for F and $\Phi$ exceeds a confidence threshold (412) (e.g., a percent difference), then calibration data (e.g., offsets) stored in the matched entry of the look up table can be used to calibrate the magnetometer (414). If the confidence does not exceed the confidence threshold (412), then a manual or automatic calibration procedure can be performed to calculate new calibration data (e.g., new offsets), and the new calibration data can be used to calibrate the magnetometer (410).

Example Mobile Device Architecture

Figure 5:
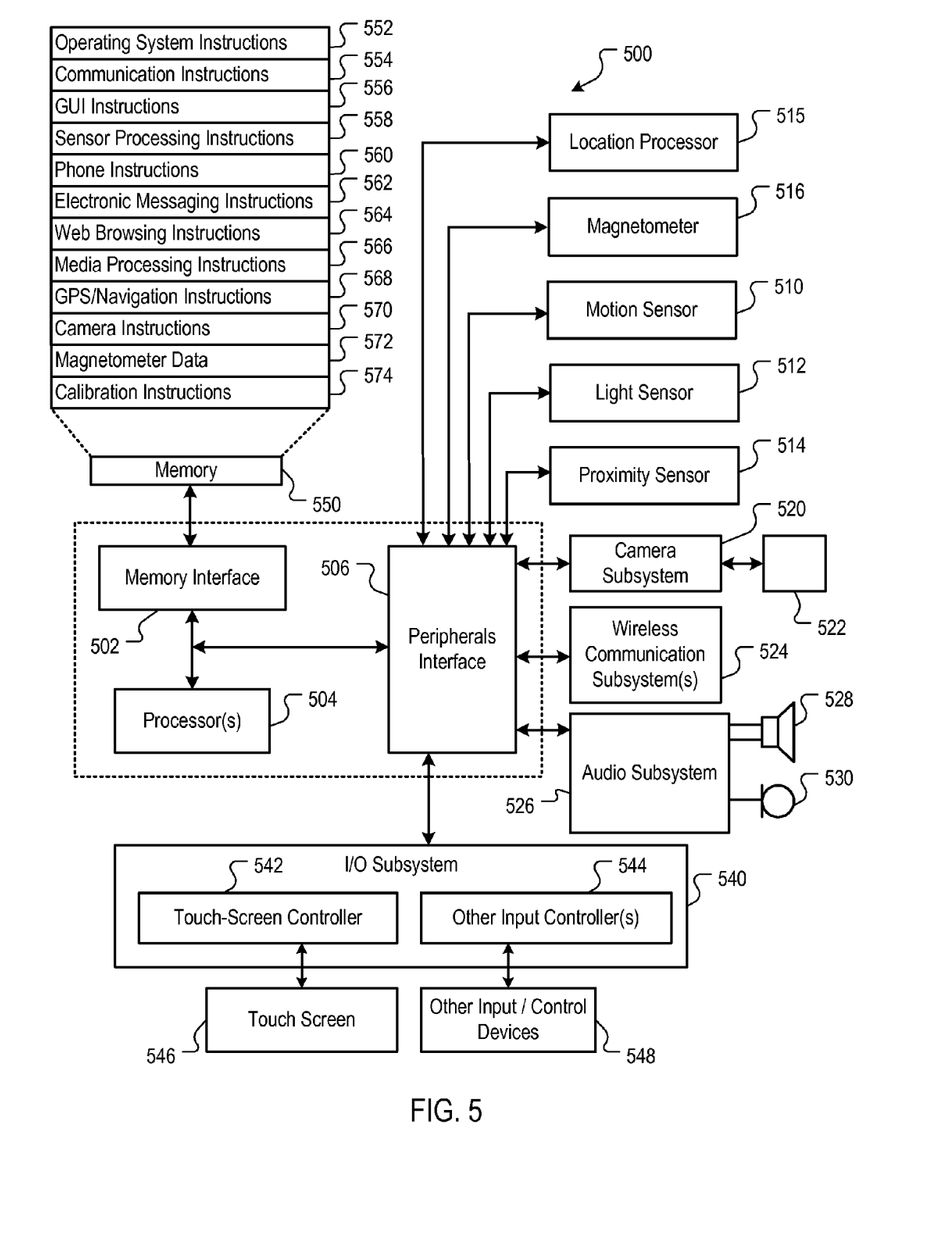
FIG. 5 is a block diagram of exemplary architecture of a mobile device employing the process of FIG. 4 in accordance with some implementations.

FIG. 5 is a block diagram of exemplary architecture 500 of a mobile device including an electronic magnetometer. The mobile device 100 can include memory interface 502, one or more data processors, image processors and/or central processing units 504, and peripherals interface 506. Memory interface 502, one or more processors 504 and/or peripherals interface 506 can be separate components or can be integrated in one or more integrated circuits. Various components in mobile device architecture 500 can be coupled together by one or more communication buses or signal lines.

Sensors, devices, and subsystems can be coupled to peripherals interface 506 to facilitate multiple functionalities. For example, motion sensor 510, light sensor 512, and proximity sensor 514 can be coupled to peripherals interface 506 to facilitate orientation, lighting, and proximity functions of the mobile device. Location processor 515 (e.g., GPS receiver) can be connected to peripherals interface 506 to provide geopositioning. Electronic magnetometer 516 (e.g., an integrated circuit chip) can also be connected to peripherals interface 506 to provide data that can be used to determine the direction of magnetic North.

Camera subsystem 520 and Optical sensor 522, e.g., a charged coupled device (CCD) or a complementary metal-oxide semiconductor (CMOS) optical sensor, can be utilized to facilitate camera functions, such as recording photographs and video clips.

Communication functions can be facilitated through one or more wireless communication subsystems 524, which can include radio frequency receivers and transmitters and/or optical (e.g., infrared) receivers and transmitters. The specific design and implementation of communication subsystem 524 can depend on the communication network(s) over which the mobile device is intended to operate. For example, the mobile device may include communication subsystems 524 designed to operate over a GSM network, a GPRS network, an EDGE network, a Wi-Fi or WiMax network, and a Bluetooth™ network. In particular, wireless communication subsystems 524 may include hosting protocols such that the mobile device may be configured as a base station for other wireless devices.

Audio subsystem 526 can be coupled to speaker 528 and microphone 530 to facilitate voice-enabled functions, such as voice recognition, voice replication, digital recording, and telephony functions. Note that speaker 528 could introduce magnetic interference to the magnetometer, as described in reference to FIGS. 1-2.

I/O subsystem 540 can include touch screen controller 542 and/or other input controller(s) 544. Touch-screen controller 542 can be coupled to touch screen 546. Touch screen 546 and touch screen controller 542 can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with touch screen 546.

Other input controller(s) 544 can be coupled to other input/control devices 548, such as one or more buttons, rocker switches, thumb-wheel, infrared port, USB port, docking station and/or a pointer device such as a stylus. The one or more buttons (not shown) can include an up/down button for volume control of speaker 528 and/or microphone 530.

In one implementation, a pressing of the button for a first duration may disengage a lock of touch screen 546; and a pressing of the button for a second duration that is longer than the first duration may turn power to the mobile device on or off. The user may be able to customize a functionality of one or more of the buttons. Touch screen 546 can, for example, also be used to implement virtual or soft buttons and/or a keyboard.

In some implementations, the mobile device can present recorded audio and/or video files, such as MP3, AAC, and MPEG files. In some implementations, the mobile device can include the functionality of an MP3 player, such as an iPod Touch™.

Memory interface 502 can be coupled to memory 550. Memory 550 can include high-speed random access memory and/or non-volatile memory, such as one or more magnetic disk storage devices, one or more optical storage devices, and/or flash memory (e.g., NAND, NOR). Memory 550 can store operating system 552, such as Darwin, RTXC, LINUX, UNIX, OS X, WINDOWS, or an embedded operating system such as VxWorks. Operating system 552 may include instructions for handling basic system services and for performing hardware dependent tasks. In some implementations, operating system 552 can be a kernel (e.g., UNIX kernel).

Memory 550 may also store communication instructions 554 to facilitate communicating with one or more additional devices, one or more computers and/or one or more servers. Memory 550 may include graphical user interface instructions 556 to facilitate graphic user interface processing; sensor processing instructions 558 to facilitate sensor-related processing and functions; phone instructions 560 to facilitate phone-related processes and functions; electronic messaging instructions 562 to facilitate electronic-messaging related processes and functions; web browsing instructions 564 to facilitate web browsing-related processes and functions; media processing instructions 566 to facilitate media processing-related processes and functions; GPS/Navigation instructions 568 to facilitate GPS and navigation-related processes and instructions; camera instructions 570 to facilitate camera-related processes and functions; magnetometer data 572 and calibration instructions 574 to facilitate magnetometer calibration, as described in reference to FIG. 2. In some implementations, GUI instructions 556 and/or media processing instructions 566 implement the features and operations described in reference to FIGS. 1-4.

Memory 550 may also store other software instructions (not shown), such as web video instructions to facilitate web video-related processes and functions; and/or web shopping instructions to facilitate web shopping-related processes and functions. In some implementations, media processing instructions 566 are divided into audio processing instructions and video processing instructions to facilitate audio processing-related processes and functions and video processing-related processes and functions, respectively. An activation record and International Mobile Equipment Identity (IMEI) or similar hardware identifier can also be stored in memory 550.

Each of the above identified instructions and applications can correspond to a set of instructions for performing one or more functions described above. These instructions need not be implemented as separate software programs, procedures, or modules. Memory 550 can include additional instructions or fewer instructions. Furthermore, various functions of the mobile device may be implemented in hardware and/or in software, including in one or more signal processing and/or application specific integrated circuits.

The disclosed and other embodiments and the functional operations described in this specification can be implemented in digital electronic circuitry, or in computer software, firmware, or hardware, including the structures disclosed in this specification and their structural equivalents, or in combinations of one or more of them. The disclosed and other embodiments can be implemented as one or more computer program products, i.e., one or more modules of computer program instructions encoded on a computer-readable medium for execution by, or to control the operation of, data processing apparatus. The computer-readable medium can be a machine-readable storage device, a machine-readable storage substrate, a memory device, or a combination of one or more them. The term "data processing apparatus" means all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, the disclosed embodiments can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

The disclosed embodiments can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of what is disclosed here, or any combination of one or more such back-end, middleware, or front-end components. The components of the system can be interconnected by any form or medium of digital data communication, e.g., a communication network. Examples of communication networks include a local area network ("LAN") and a wide area network ("WAN"), e.g., the Internet.

While this specification contains many specifics, these should not be construed as limitations on the scope of what being claims or of what may be claimed, but rather as descriptions of features specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understand as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Particular embodiments of the subject matter described in this specification have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing may be advantageous.

What is claimed is:

1. A computer-implemented method, comprising:
   receiving a current reading from a magnetometer of a mobile device;
   identifying historical data of readings previously calibrated using the mobile device, wherein each previously-calibrated reading includes an associated bias offset;
   calculating multiple estimates of Earth's current magnetic field by subtracting bias offsets for the previously-calibrated readings from the current reading;
   determining a confidence of a match between at least one estimate of the multiple estimates of Earth's current magnetic field and historical data, where the confidence is determined at least in part on historical data including magnitudes of Earth's magnetic field for the previously-calibrated readings; and
   if the confidence of the match for the at least one estimate of Earth's current magnetic field exceeds a threshold confidence level, calibrating the magnetometer with historical calibration data;
   wherein the method is performed by one or more processors.

2. The method of claim 1, where if the reading does not match historical data, further comprising:
   performing a calibration procedure to determine new calibration data.

3. The method of claim 2, further comprising:
   calibrating the magnetometer using the new calibration data.

4. The method of claim 1, where the confidence is determined based on an angle between the at least one estimate of Earth's current magnetic field vector and Earth's gravitational acceleration vector.

5. The method of claim 1,
   wherein the historical data was stored in a look-up table on the mobile device during a previous calibration procedure.

6. The method of claim 5, further comprising searching the look-up table based on search parameters that include a parameter used to dynamically adjust sensor readings output by the magnetometer.

7. An apparatus, comprising:
   a magnetometer;
   memory storing historical magnetometer data; and
   a processor coupled to the magnetometer and the memory, the processor configured for:
      receiving a current reading from a magnetometer of a mobile device;
      identifying historical data of readings previously calibrated using the apparatus, wherein each previously-calibrated reading includes an associated bias offset;
      calculating multiple estimates of Earth's current magnetic field by subtracting bias offsets for the previously-calibrated readings from the current reading;
      determining a confidence of a match between at least one estimate of the multiple estimates of Earth's current magnetic field and historical data including magnitudes of Earth's magnetic field for the previously-calibrated readings;

if the confidence of the match for the at least one estimate of Earth's current magnetic field exceeds a threshold confidence level, calibrating the magnetometer with historical calibration data; and if the confidence of the match for the at least one estimate of Earth's current magnetic field does not exceed the threshold confidence level, performing a calibration procedure to determine new calibration data.

8. The apparatus of claim 7, where the processor is further configured for calibrating the magnetometer using the new calibration data.

9. The apparatus of claim 7, where the processor is further configured for performing a calibration procedure to determine new calibration data if the reading does not match the historical data.

10. The apparatus of claim 7, where the confidence is determined based on an angle between the at least one estimate of Earth's current magnetic field vector and Earth's gravitational acceleration vector.

11. The apparatus of claim 7,
wherein the historical data was stored in a look-up table on the mobile device during a previous calibration procedure.

12. The apparatus of claim 11, further comprising searching the look-up table based on search parameters that include a parameter used to dynamically adjust sensor readings output by the magnetometer.

13. A non-transitory computer-readable medium having instructions stored thereon, which, when executed by at least one processor, causes the processor to perform operations comprising:

receiving a current reading from a magnetometer of a mobile device;

identifying historical data of readings previously calibrated using the mobile device, wherein each previously-calibrated reading includes an associated bias offset;

calculating multiple estimates of Earth's current magnetic field by subtracting bias offsets for the previously-calibrated readings from the current reading;

determining a confidence of a match between at least one estimate of the multiple estimates of Earth's current magnetic field and historical data including magnitudes of Earth's magnetic field for the previously-calibrated readings;

if the confidence of the match for the at least one estimate of Earth's current magnetic field exceeds a threshold confidence level, calibrating the magnetometer with historical calibration data; and if the confidence of the match for the at least one estimate of Earth's current magnetic field does not exceed the threshold confidence level, performing a calibration procedure to determine new calibration data.

14. The computer-readable medium of claim 13, where if the reading does not match the historical data, further comprising:

performing a calibration procedure to determine new calibration data.

15. The computer-readable medium of claim 13, where the confidence is determined based on an angle between the at least one estimate of Earth's current magnetic field vector and Earth's gravitational acceleration vector.

* * * * *